(12) United States Patent
Mahajan et al.

(10) Patent No.: US 11,937,381 B2
(45) Date of Patent: Mar. 19, 2024

(54) FORMING ELECTRICAL INTERCONNECTIONS USING CAPILLARY MICROFLUIDICS

(71) Applicant: 3M INNOVATIVE PROPERTIES COMPANY, St. Paul, MN (US)

(72) Inventors: Ankit Mahajan, Cupertino, CA (US); Mikhail L Pekurovsky, Bloomington, MN (US); Saagar A. Shah, Minneapolis, MN (US); Kayla C. Niccum, Maplewood, MN (US); Kara A. Meyers, Oakdale, MN (US); Christopher G. Walker, Edina, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 224 days.

(21) Appl. No.: 17/309,699

(22) PCT Filed: Dec. 30, 2019

(86) PCT No.: PCT/IB2019/061450
§ 371 (c)(1),
(2) Date: Jun. 15, 2021

(87) PCT Pub. No.: WO2020/141445
PCT Pub. Date: Jul. 9, 2020

(65) Prior Publication Data
US 2022/0078918 A1    Mar. 10, 2022

Related U.S. Application Data

(60) Provisional application No. 62/787,133, filed on Dec. 31, 2018.

(51) Int. Cl.
*H05K 3/32* (2006.01)
*H01L 21/48* (2006.01)
(Continued)

(52) U.S. Cl.
CPC .......... *H05K 3/321* (2013.01); *H01L 21/486* (2013.01); *H01L 23/49827* (2013.01);
(Continued)

(58) Field of Classification Search
CPC .... H05K 3/321; H05K 3/1258; H05K 3/1283; H05K 3/4069; H05K 1/092;
(Continued)

(56) References Cited

U.S. PATENT DOCUMENTS 7,199,033 B2 *   4/2007  Hirai ..................... H05K 3/125
                                                                438/584
9,116,145 B2     8/2015  Li
(Continued)

FOREIGN PATENT DOCUMENTS

DE    102007043396       3/2009
JP    2006332615 A       12/2006
(Continued)

OTHER PUBLICATIONS

International Search Report for PCT International Application No. PCT/IB2019/061450, dated Apr. 6, 2020, 4 pages.

*Primary Examiner* — Donghai D Nguyen
(74) *Attorney, Agent, or Firm* — Thomas M. Spielbauer

(57) ABSTRACT

A method for manufacturing an electronic device includes providing a substrate with a first major surface having a microchannel, wherein the microchannel has a first end and a second end; dispensing a conductive liquid in the microchannel to cause the conductive liquid to move, primarily by capillary pressure, in a first direction toward the first end of the microchannel and in a second direction toward the second end of the microchannel; and solidifying the conductive liquid to form an electrically conductive trace elec-
(Continued)

trically connecting a first electronic device at the first end of the microchannel to a second electronic device at the second end of the microchannel.

10 Claims, 7 Drawing Sheets

(51) Int. Cl.
*H01L 23/00* (2006.01)
*H01L 23/498* (2006.01)
*H01R 12/62* (2011.01)
*H05K 3/12* (2006.01)
*H05K 3/36* (2006.01)
*H05K 3/40* (2006.01)
*H01R 4/04* (2006.01)

(52) U.S. Cl.
CPC .......... *H01L 23/4985* (2013.01); *H01L 24/32* (2013.01); *H01R 12/62* (2013.01); *H05K 3/1258* (2013.01); *H05K 3/1283* (2013.01); *H05K 3/361* (2013.01); *H05K 3/4069* (2013.01); *H01L 2224/32235* (2013.01); *H01R 4/04* (2013.01); *H05K 2203/1545* (2013.01)

(58) Field of Classification Search
CPC ... H01L 21/486; H01L 23/4985; H01L 24/32; H01L 2224/32235; H01L 21/4867; Y10T 29/4913; Y10T 29/49144; Y10T 29/49155; Y10T 29/49165

See application file for complete search history.

(56) References Cited

U.S. PATENT DOCUMENTS

| | | |
|---|---|---|
| 9,167,684 B2 * | 10/2015 | Allen ...................... H01L 24/82 |
| 9,401,306 B2 | 7/2016 | Mahajan |
| 10,971,468 B2 * | 4/2021 | Mahajan ................. H01L 23/13 |
| 2007/0000970 A1 | 1/2007 | Sugahara |
| 2012/0192415 A1 | 8/2012 | Sugahara |

FOREIGN PATENT DOCUMENTS

| | | |
|---|---|---|
| WO | WO 2018-094057 | 5/2018 |
| WO | WO 2019-171214 | 9/2019 |

* cited by examiner

FORMING ELECTRICAL INTERCONNECTIONS USING CAPILLARY MICROFLUIDICS

CROSS REFERENCE TO RELATED APPLICATIONS

This application is a national stage filing under 35 U.S.C. 371 of PCT/IB2019/061450, filed Dec. 30, 2019, which claims the benefit of U.S. Application No. 62/787,133, filed Dec. 31, 2018, the disclosure of which is incorporated by reference in its/their entirety herein.

BACKGROUND

Web-based printing of solid semiconductor dies combines the computational prowess of semiconductor technology with the high-throughputs and form-factor flexibility of roll-to-roll manufacturing processes. Flexible hybrid electronics manufacturing requires that semiconductor dies be reliably and accurately registered to printed traces on moving webs. Current alignment mechanisms suitable for wafer-based semiconductor devices may not be readily transferred to web-based processes.

Techniques are needed to consistently and accurately achieve registration at a level of less than about ten micrometers between solid circuit dies and electrically conductive interconnects on a substrate, in particular, a moving, flexible substrate utilized in a roll-to-roll manufacturing process.

SUMMARY

In general, the present disclosure is directed to articles and methods that provide automatic registration via a capillary liquid flow of an electrically conductive material to electrically interconnect aligned or registered circuit traces or the electrically conductive contact pads of electronic components such as, for example, a circuit die, placed on a moving, pliable substrate. The automatic registration described herein can be tolerant of various sources of misalignment in web-based processes such as, for example, a substrate distortion from in-line thermal cycles and/or tension control.

In one aspect, the present disclosure is directed to a method for manufacturing an electronic device. The method includes providing a substrate with a first major surface having a microchannel, wherein the microchannel has a first end and a second end; dispensing a conductive liquid in the microchannel to cause the conductive liquid to move, primarily by capillary pressure, in a first direction toward the first end of the microchannel and in a second direction toward the second end of the microchannel; and solidifying the conductive liquid to form an electrically conductive trace electrically connecting a first electronic device at the first end of the microchannel to a second electronic device at the second end of the microchannel.

In another aspect, the present disclosure is directed to a method for manufacturing an electronic device, including: placing a solid circuit die on a first major surface of a substrate having a microchannel such that at least one contact pad on the solid circuit die resides in a first end of the microchannel, wherein a second end of the microchannel terminates in a bore extending between the first major surface of the substrate and an opposing second major surface thereof; registering an electrically conductive trace on the second major surface of the substrate with the bore at the second end of the microchannel; dispensing a conductive liquid in the microchannel between the first end and the second end thereof, wherein the volume of the conductive liquid dispensed in the microchannel is significantly larger than the volume of the portion of the channel underlying the conductive liquid dispensed; and flowing the conductive liquid, primarily by capillary pressure, in a first direction toward the contact pad and in a second direction toward the bore, wherein the conductive liquid directly contacts the contact pad on the solid circuit die and enters the bore to directly contact the electrically conductive trace; and solidifying the conductive liquid to form an electrically conductive trace on the first major surface of the substrate electrically connecting the contact pad on the solid circuit die to the electrically conductive trace on the second major surface of the substrate.

In another aspect, the present disclosure is directed to a method for manufacturing an electronic device, including: placing a solid circuit die on a first major surface of a substrate having a microchannel with a first end and a second end, wherein a contact pad on the solid circuit die resides in the first end of the microchannel, and wherein the second end of the microchannel terminates in a bore extending between the first major surface of the substrate and an opposing second major surface thereof, the bore including a first region proximal to the first major surface of the substrate, the first region of the bore opening into a second region proximal to the second major surface of the substrate; registering an electrically conductive trace on the second major surface of the substrate with the cylindrical region of the bore; dispensing a first conductive liquid in the microchannel between the first end and the second end thereof; flowing the first conductive liquid, primarily by capillary pressure, in a first direction toward the contact pad and in a second direction toward the bore, wherein the conductive liquid directly contacts the contact pad on the solid circuit die and flows into the bore to reside on a shoulder in the first region of the bore such that the second region of the bore is substantially free of the first conductive liquid; applying a sufficient amount of a second conductive liquid, different from the first conductive liquid, in the bore such that the second conductive liquid flows into the second region thereof to directly contact the conductive trace and fill the bore to directly contact the first conductive liquid on the shoulder of the first region of the bore, and wherein the microchannel on the first major surface of the substrate is substantially free of the second conductive liquid; and solidifying the first conductive liquid and the second conductive liquid to form an electrically conductive trace on the first major surface of the substrate connecting the contact pad on the solid circuit die with the electrically conductive trace on the second major surface of the substrate.

In another aspect, the present disclosure is directed to an article, including a flexible polymeric substrate with a first major surface having at least one microchannel with a substantially constant width and depth and extending from a first end to a second end thereof, wherein the second end of the microchannel terminates in a bore extending between the first major surface of the substrate and an opposing second major surface thereof. A solid circuit die resides on the first major surface of the substrate, wherein a contact pad of the solid circuit die resides in the first end of the microchannel. A first electrically conductive trace resides on the second major surface of the substrate and aligned with the bore at the second end of the microchannel. A conductive liquid is in the microchannel and in the bore, wherein the conductive liquid contacts the contact pad on the solid circuit die and the first electrically conductive trace on the second major surface of the substrate.

In another aspect, the present disclosure is directed to an article including a flexible polymeric substrate with a first major surface having at least one microchannel with a substantially constant width and depth and extending from a first end to a second end thereof, wherein the second end of the microchannel terminates in a bore extending between the first major surface of the substrate and an opposing second major surface thereof, the bore including a first region proximal to the first major surface of the substrate, the first region opening into a second region proximal to the second major surface of the substrate. A solid circuit die resides on the first major surface of the substrate, wherein a contact pad of the solid circuit die resides in the first end of the microchannel. A first electrically conductive trace resides on the second major surface of the substrate, wherein the first electrically conductive trace is aligned with the cylindrical region of the bore. A first conductive liquid is in the microchannel directly contacting the contact pad on the solid circuit die and extending onto a shoulder in the first region of the bore, wherein the first conductive liquid does not extend into the second region of the bore; and a second conductive liquid in the second region of the bore and contacting the first conductive liquid and the first conductive trace.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like symbols in the drawings indicate like elements.

DETAILED DESCRIPTION

Figure 1:
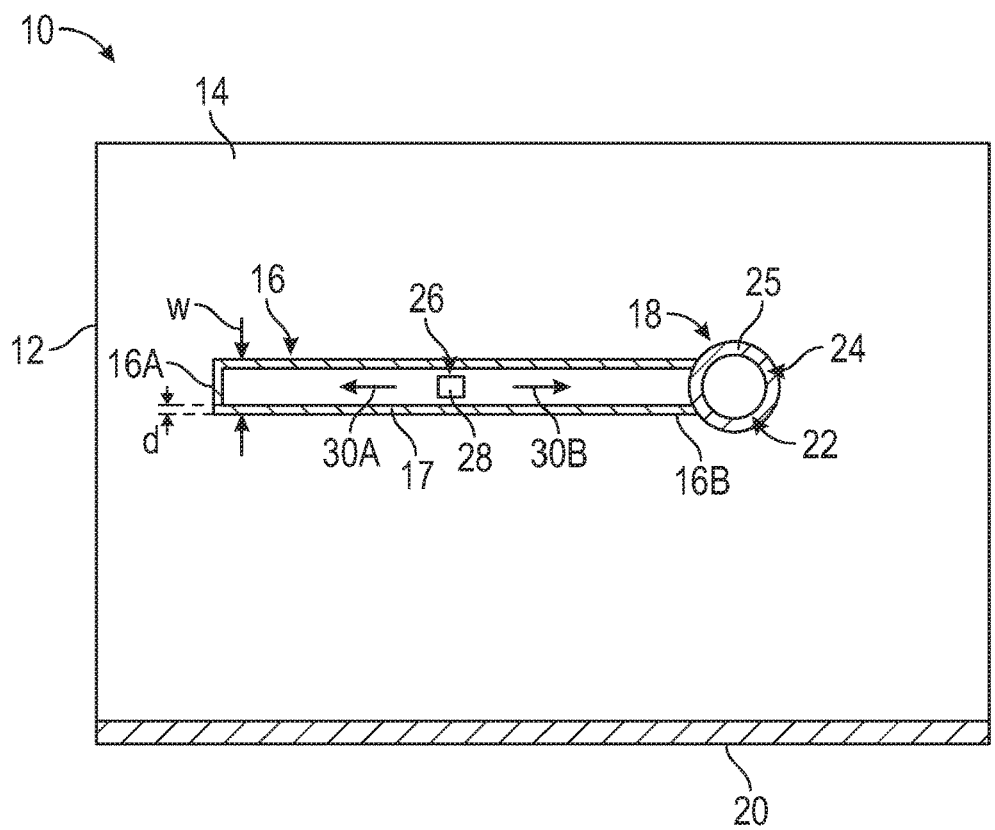
FIG. 1 is schematic overhead view of an embodiment of a substrate including a microchannel.

FIG. 1 illustrates a top view of an article 10, which includes a substrate 12 with a structured first major surface 14. In some embodiments, the substrate 12 can be a flexible substrate, for example, a web of a polymeric material having an indefinite length. The flexible substrate 12 or web may be stretched (e.g., along a machine direction and/or a cross direction) when moving along a web path between rollers in, for example, a roll-to-roll manufacturing process. The substrate 12 can be made of any suitable materials for forming the features therein or thereon to support capillary fluid flow along the first major surface 14. In some embodiments, which are not intended to be limiting, the flexible substrate 12 is a polymeric film including polyesters (e.g., polyethylene terephthalate (PET), polyester naphthalate (PEN), and polycarbonate (PC)), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones, polyethylene, polystyrene, polyurethane, and mixtures and combinations thereof. In some embodiments, the substrate 12 or a portion thereof may be rigid, and suitable rigid materials include, but are not limited to, bakelite, acrylonitrile butadiene styrene (ABS), cured epoxy systems, and the like.

The substrate 12 can optionally be treated to prior to or after patterning with techniques such as, for example, solvent or chemical washing, heating, plasma treatment, ultraviolet radiation (UV)-ozone treatment, corona discharge, and combinations thereof.

In some example embodiments, the substrate 12 may have a thickness of, for example, 2 mm or less, 1 mm or less, 500 micrometers or less, or 200 micrometers or less.

At least one channel 16 is formed on the first major surface 14, and extends in length between a first end 16A and a second end 16B. The channel 16 may have any suitable dimensions, and in the embodiment of FIG. 1, which is not intended to be limiting, the channel 16 has a substantially constant width w and a substantially constant thickness d of a channel wall 17 between the first end 16A and the second end 16B. In various embodiments, the channels 16 formed on the major surface 14 are microchannels that have a minimum length of, for example, 500 micrometers or less, 300 micrometers or less, 100 micrometers or less, 50 micrometers or less, or 10 micrometers or less.

The channel 16 is configured to allow a conductive fluid deposited in a region 26 between the first end 16A and the second end 16B of the channel 16 to flow, primarily by capillary force, in opposite directions 30A, 30B along the channel 16 to reach the first end 16A and the second end 16B of the channel 16.

In the embodiment of FIG. 1, the channel 16 is open on the upper surface thereof adjacent to the first major surface 14 of the substrate 12, but in alternate embodiments all or a portion of the channel 16 may be enclosed by an upper wall (not shown in FIG. 1). While one channel 16 is shown in the embodiment of FIG. 1, it is to be understood that any numbers of channels can be formed on the substrate 12, and the channels can be fluidly connected in various configurations as needed to form electrical connections to circuit elements, electronic devices, and the like.

In the embodiment of FIG. 1, the channel 16 includes indentations formed into the major surface 14 of the substrate 12, but in alternate embodiments can include embossments such as, for example, ridges, that project above the major surface 14. In some embodiments, the channel walls 17 of the channel 16 can be formed by adding materials on the major surface 14 by any suitable techniques including, for example, microreplication, hot embossing, molding, soft lithography, etching, flexographic printing, 3D printing, and the like.

In some embodiments, the channel 16 may include an optional upwardly projecting liquid flow control feature, such as a post 28, at any location along the channel 16 between the first end 16A and the second end 16B thereof. The post 28 can be of any suitable shape to facilitate or direct capillary fluid flow of the conductive fluid along the directions 30A, 30B in the channel 16. In various embodiments, the post 28 can have a shape such as, for example, cubic, cuboid, cylindrical, hemispherical, and the like. In various embodiments, the channel 16 may include any suitable number of posts or other flow control features to facilitate or direct capillary flow of the conductive fluid in the channel 16.

The second end 16B of the channel 16 terminates a bore 18, which extends through the first major surface 14 of the substrate 12 to an opposed second major surface 20 thereof. The bore 18 may be formed by any suitable technique such as chemical etching, laser etching or drilling, mechanical punching, and the like. The bore 18 includes a first region 22 proximal the first major surface 14 of the substrate 12, which opens into a second region 40 proximal the second major surface 20 of the substrate 12. A bore wall 25 of the first region 22 includes a shoulder 24 at the transition between the first region 22 and the second region 40. In some embodiments, which are not intended to be limiting, the bore 18 is generally cylindrical such that the bore wall 25 has a curvature, and the opening of the bore 18 as viewed from above in FIG. 1 is circular or elliptical. In various embodiments, the first regions 22 and the second regions 40 of the bore 18 can have any suitable shape, and the shape of the first region 22 and the second region 40 may be the same or different.

Figure 2A:
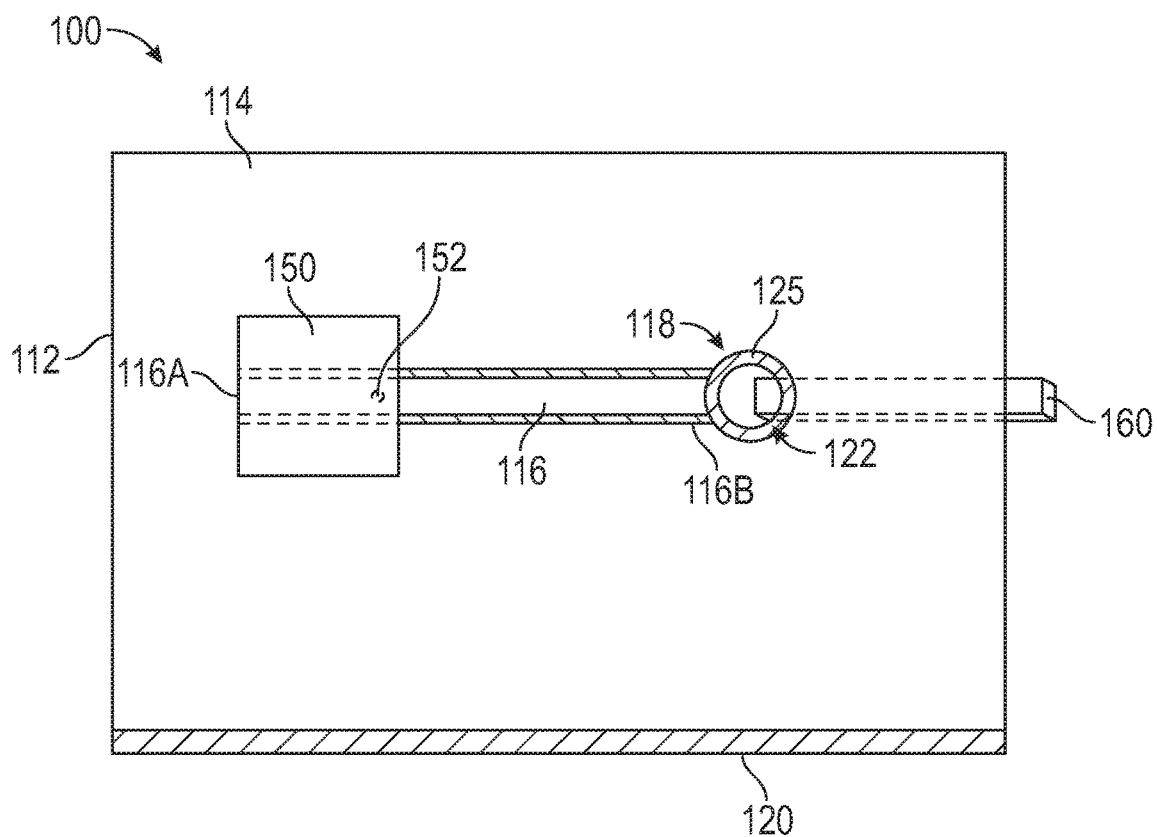
FIG. 2A is a schematic overhead view of an embodiment of an article including the substrate of FIG. 1 having an electronic device placed thereon.
Figure 2B:
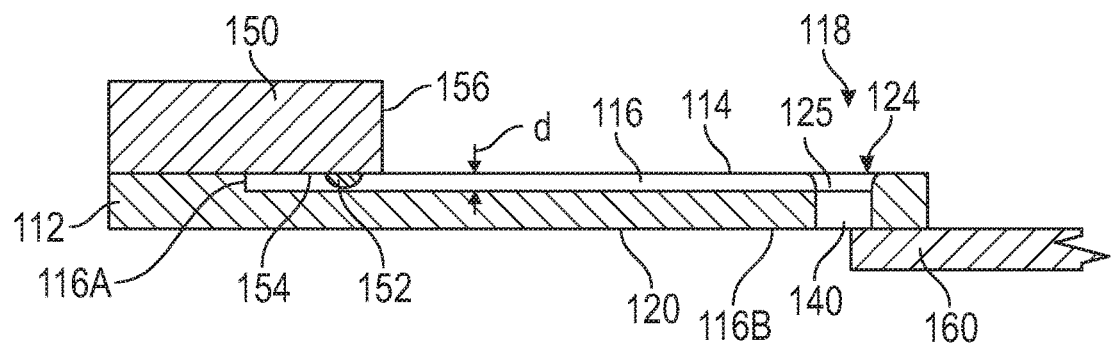
FIG. 2B is a cross-sectional view along line A-A' of the article of FIG. 2A.

Referring to FIGS. 2A-2B, an article 100 includes a solid circuit die 150 placed on a first major surface 114 of a substrate 112. The solid circuit die 150 includes at least one contact pad 152 on a major surface 154 thereof. The contact pad 152 is positioned within a channel 116 in the surface 114 of the substrate 112. The configuration of the contact pads 152 on the circuit die 150 may vary widely, and in various embodiments the contact pads 152 can be disposed along the edges 156 of the circuit die 150, or be partially embedded in the circuit die 150 and have an exposed surface or portion adjacent to the edges 156. The contact pads 152 may be made of any suitable electrically conductive materials such as, for example, metals. While the contact pad 152 is shown as having a bump-like shape, the contact pads may vary with the specific types of circuit die, and may include, for example, elongate legs extending from the casing of the circuit die 150. In some embodiments, the contact pads 152 may include electroplated metals (e.g., Cu/Au) on the surface of the casing of the circuit die 150.

In various embodiments, which are not intended to be limiting, the circuit die 150 can include a circuit chip having one or more contact pads arranged along the edges 156 thereof, a rigid semiconductor die, a printed circuit board (PCB), a flexible printed circuit (FPC), or an ultra-thin chip. In some embodiments, the circuit die 150 may have a thickness substantially the same as a depth d of the channel 116. In one non-limiting example, if the circuit die 150 is an ultra-thin chip with a thickness of about 2 micrometers to about 200 micrometers, about 5 micrometers to about 100 micrometers, or about 10 micrometers to about 100 micrometers, the depth d of the channel can be, for example, two times, four times, six times, eight times, or ten times greater than the thickness of circuit die 150. In some embodiments, the ultra-thin circuit die may be loaded on a removable handle substrate (not shown in FIGS. 2A-2B) to facilitate the disposition into the channel 116.

In some embodiments, the surface 154 of the circuit die 150 can optionally be attached to the first major surface 114 of the substrate 112 with an adhesive (not shown in FIGS. 2A-2B). Suitable adhesives include, but are not limited to, structural adhesives, acrylic adhesives, epoxy adhesive, urethane adhesives, optical adhesives, and mixtures and combinations thereof. In some embodiments, the adhesive can be a UV curable or activated adhesive such as, for example, a UV curable polyurethane. The adhesive should be precisely applied to attach the circuit die 150 on the major surface 114 without blocking the channel 116.

In the embodiment of FIGS. 2A-2B, the contact pad 152 is positioned at a first end 116A of the channel 116, although the contact pad 152 could be placed at any position between the first end 116A and the second end 116B of the channel 116. The second end 116B of the channel 116 terminates in a bore 118, which extends through the substrate 112 from the first major surface 114 thereof to a second major surface 120. The bore 118 includes a first region 122 proximal to the first major surface 114 of the substrate 112. The first region 122 includes a bore wall 125 forming a shoulder 124 at the transition between the first region 122 and a second region 140, which extends from the first region 122 to the second major surface 120 of the substrate 112.

An electrically conductive trace 160 is placed adjacent to the second major surface 120 of the substrate 112 and registered with the bore 118. In the embodiment of FIGS. 2A-2B, the electrically conductive trace 160 is positioned such that at least a portion thereof underlies the region 140 of the bore 118. The size and configuration of the electrically conductive trace 160 may vary widely, and in some embodiments can include a contact or an elongate strand of electrically conductive material such as, for example metals used for electrical circuit connections like copper, silver, gold, and mixtures and combinations thereof.

Figure 3A:
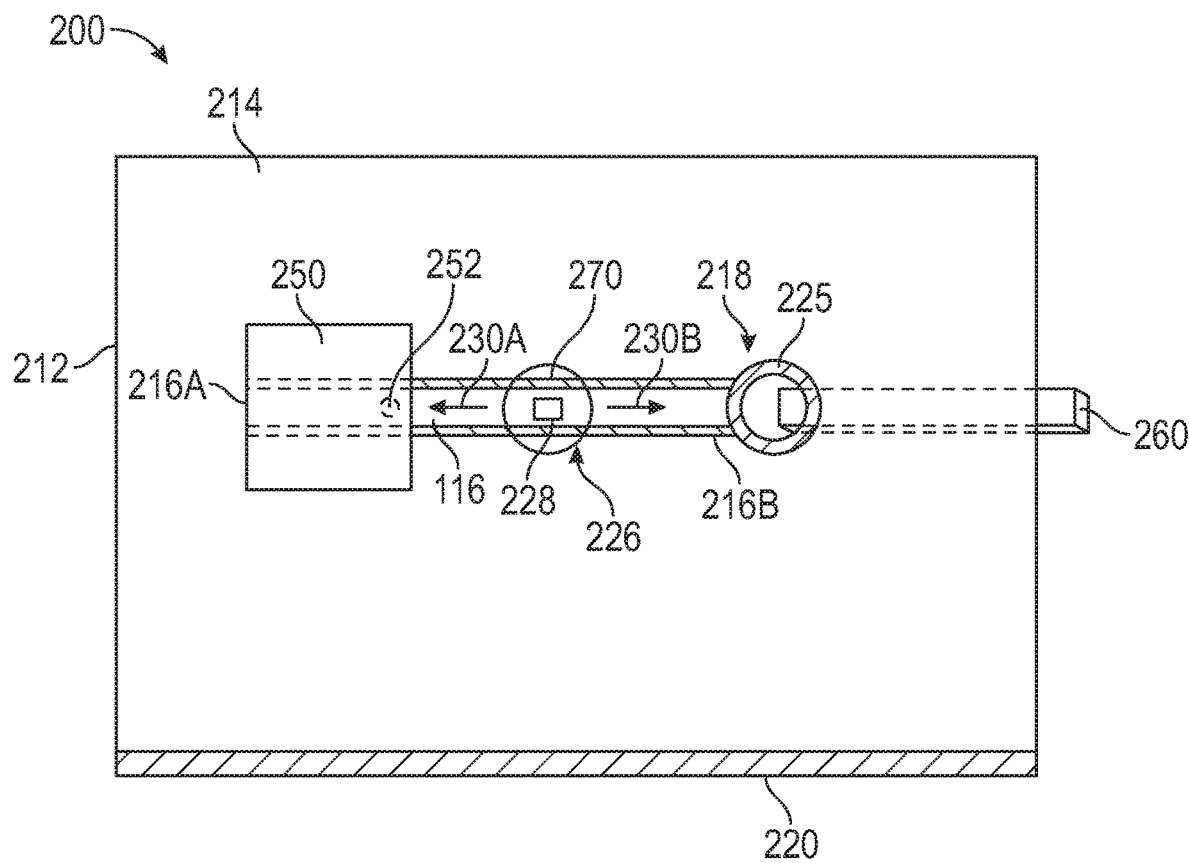
FIG. 3A is a schematic overhead view of an embodiment of an article including the substrate of FIG. 2A with a conductive liquid placed on the microchannel.
Figure 3B:
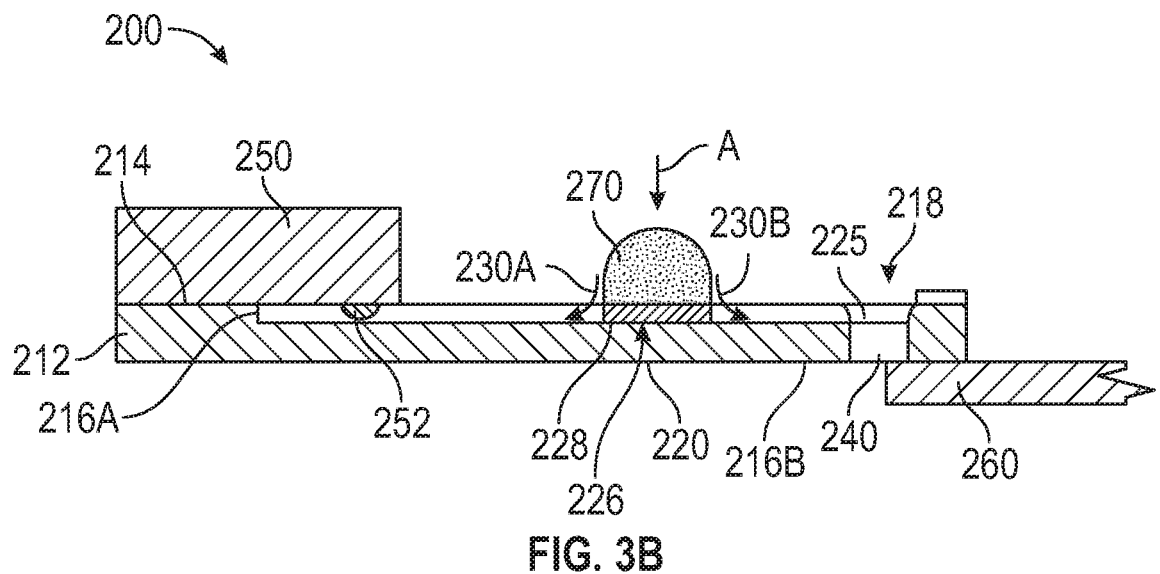
FIG. 3B is a schematic cross-sectional view along line B-B' of the article of FIG. 3A.

Referring now to FIGS. 3A-3B, in a construction 200, a conductive liquid 270 is dispensed along the direction of arrow A and onto the channel 216 formed on the first major surface 214 of a substrate 212.

In various embodiments, the conductive liquid 270 can be any liquid composition that is electrically conductive in a liquid state (for example, metals), or is electrically non-conductive or weakly conductive in a liquid state and becomes electrically conductive when solidified. The conductive liquid 270 includes a sufficient amount of a liquid carrier to make the conductive liquid flowable in the channel 216 primarily by a capillary force. In some embodiments, the conductive liquid 270 can be made to flow in the channel 216 by applying the conductive liquid under pressure in the channel 216 under pressure to enhance capillary flow.

The conductive liquid 270 includes an electrically conductive material, or an electrically non-conductive material that can be converted into an electrically conductive material, which is dispersed in a liquid to facilitate more uniform deposition onto the substrate 212 by using, for example, a coater or sprayer. Suitable electrically conductive materials for the conductive liquid 270 include, but are not limited to, metal particles, nanowires, metal salts that are conductive at room temperature or become conductive when heated or otherwise reduced to metals, conductive polymers, and mixtures and combinations thereof. In some embodiments, the conductive liquid 270 includes conductive inks including a conductive metal such as silver ink, silver nanoparticle ink, reactive silver ink, copper ink, and conductive polymer inks, as well as liquid metals or alloys (e.g., metals or alloys that melt at relatively low temperatures and solidify at room temperatures), and the like. In some embodiments, the liquid composition 270 is a conductive ink that is curable with actinic radiation such as, for example, a UV curable or activated ink.

In some embodiments, the conductive material in the conductive liquid 270 may be silver flakes or spheres, a blend of carbon/graphite particles or a blend of silver flakes/carbon particles. Particle sizes typically range from, for example, about 0.5 microns to about 10.0 microns in diameter. When these flakes or particles are suspended in the polymer binder, they are randomly spaced through the liquid. Once the solvent is evaporated, they condense, forming a conductive path or circuit. Of the conductive materials, silver is the least resistive and the most expensive while carbon/graphite offers the best combination of low resistance and low price. Suitable conductive inks are available from Tekra, Inc., New Berlin, WI.

Any non-corrosive liquid in which the conductive materials can form a stable dispersion can be used in the conductive liquid 270, and suitable examples of liquid carriers include, but are not limited to, water, alcohols, ketones, ethers, hydrocarbons or an aromatic solvent (benzene, toluene, xylene, etc.). In some embodiments, the carrier liquid is volatile, having a boiling point of no more than 200 degrees C. (° C.), no more than 150° C., or no more than 100° C.

In addition, the conductive liquid 270 may contain additives or binders to control viscosity, corrosion, adhesion, and dispersion of the conductive material. Examples of suitable additives or binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene glycol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., those available under the trade designation Zonyl from DuPont).

In one example, a conductive liquid, or "ink," includes, by weight, from 0.0025% to 0.1% surfactant (e.g., a preferred range is from 0.0025% to 0.05% for Zonyl FSO-100, from 0.02% to 4% viscosity modifier (e.g., a preferred range is 0.02% to 0.5% for HPMC), from 94.5% to 99.0% solvent and from 0.05% to 1.4% conductive materials. Representative examples of suitable surfactants include those available from DowDuPont, Wilmington, DE, under the trade designations Zonyl FSN, Zonyl FSO, and Zonyl FSH, those available from Millipore Sigma, St. Louis, MO, under the trade designations Triton (×100, ×114, ×45), those available from Evonik Industries, Parsippany, NJ, under the trade designations Dynol (604, 607), n-dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, hydroxy ethyl cellulose. Examples of suitable solvents that may be present in a nanowire dispersion that includes the aforementioned binders or additives, include water and isopropanol.

In another embodiment, the conductive liquid can include an adhesive such as, for example, adhesives dissolved in liquid solvents such as water acetone, toluene, methyl ethyl ketone (MEK), and the like.

The conductive liquid 270 can be cured, hardened or solidified by removing at least portion of the liquid carrier to leave a continuous layer of electrically conductive material that forms an electrically conductive trace in the channel 216. The conductive liquid 270 may be cured and/or hardened, or sintered. "Cured or solidified" refers to a process where the solvent or liquid carrier is removed from the conductive liquid 270 to form an interconnect circuit pattern. Suitable curing conditions are well known in the art and include by way of example, heating, irradiating with visible or ultraviolet (UV) light, electron beams, and the like. Alternatively, "harden(s) or hardening" may be caused by solvent removal during drying, for example, without polymerization or cross-linking.

The conductive liquid 270 can be delivered at any position along the channel 216, but is typically deposited at a region 226 between the first end 216A and the second end 216B of the channel 216 so that the conductive liquid 270 can flow, primarily by capillary force, in opposite directions 230A, 230B along the channel 216 to reach the first end 216A and the second end 216B. In some embodiments, the conductive fluid is dispensed onto the channel 216 between the first end 216A and the second end 216B thereof in an amount sufficient such that the volume of conductive fluid deposited is significantly larger than the volume of the portion 226 of the channel 216 overlain by the deposited conductive fluid. In various embodiments, the volume of deposited conductive fluid is at least five times the volume of the underlying portion 226 of the microchannel 216, or at least ten times the volume of the underlying portion of the underlying portion 226 of the microchannel 216. The conductive liquid 270 can be deposited by various methods including, for example, pouring, funneling, ink jet printing, piezo dispensing, needle dispensing, micro-injection, screen printing, flexographic printing, and the like.

In the embodiment of FIGS. 3A-3B, the conductive liquid 270 is directly disposed on the major surface 114 in the region 226 so that the conductive liquid 270 can flow in opposed directions 230A, 230B along the channel 216. As noted above, in some embodiments, the surrounding area of the substrate can be selectively treated or patterned to enhance the collection or flow of the conductive liquid 270 into the channel 216. For example, suitable surface treatment or patterning methods including microreplication, flexographic printing, screen printing, gravure printing, and the like, may be used to produce one or more structures within the channel 216, or adjacent thereto, and projecting away from or into the substrate 212 to facilitate or direct flow of the conductive liquid 270. In one example embodiment, an optional post 228 or arrangement of posts projecting upwardly from the first major surface 214 of the substrate 212 may be formed in the channel 216 to control flow of the conductive liquid 270, and in some embodiments the post 228 may be positioned to bisect the channel 216. The conductive liquid 270 may be deposited directly onto the post 228 as shown in FIGS. 3A-3B, or may be deposited elsewhere in the channel 216 so that the liquid flows into or around the post 228.

When the conductive liquid 270 is delivered into the channel 216, the conductive liquid 270 can be routed, primarily by virtue of capillary pressure, through the channel 216 in a first direction 230A toward the conductive pad 252 on the circuit die 250 proximal the first end 216A of the channel, and in a second direction 230B toward the bore 218 proximal the second end 216B of the channel 216. While not wanting to be bounded by theory, presently available evidence indicates that a number of factors can affect the ability of the conductive liquid 270 to move through the channel 216 via capillarity. Such factors may include, for example, the dimensions of the channel 216, the viscosity of the conductive liquid 270, the surface energy of the substrate 212, the surface tension of the conductive liquid 270, the drying conditions for the conductive liquid 270, and the like. A number of these factors were discussed in U.S. Pat. No. 9,401,306 (Mahajan et al), which is incorporated herein by reference.

To produce effective capillary flow, the channel 216 can have any suitable dimensions (e.g., width, depth, or length) which can, in part, be determined by one or more of the factors described above. As noted above, in some embodiments the channel 216 may be a microchannel with a width or depth in a range, for example, from about 0.01 micrometers to about 500 micrometers, from about 0.05 micrometers to about 200 micrometers, or from about 0.1 micrometers to about 100 micrometers.

Figure 3C:
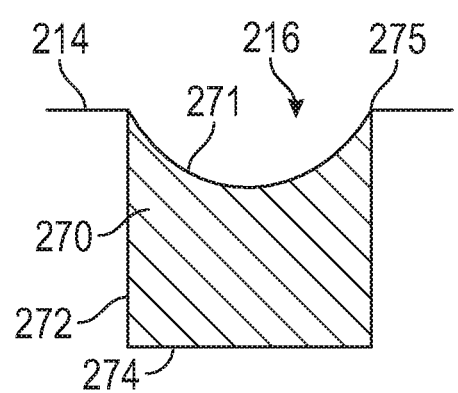
FIG. 3C is a schematic cross-sectional view of the channel in the article of FIG. 3A.
Figure 3D:
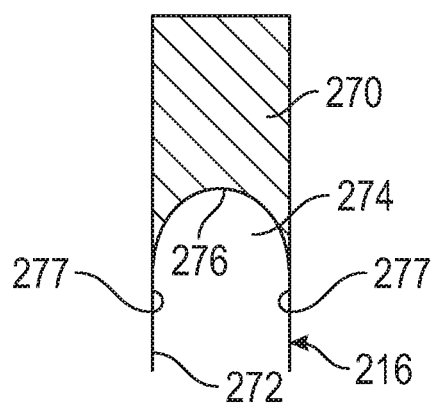
FIG. 3D is a schematic overhead view of the channel in the article of FIG. 3A.

Referring to FIGS. 3C-3D, when the conductive liquid 270 moves, primarily via capillarity, into the channel 216, the side walls 272 and the bottom wall 274 of the channel 216 can be wetted by the conductive liquid 270 to form one or more curved menisci. The conductive liquid 270 should be delivered in an amount sufficient to cover a portion of the side walls 272 adjacent to the bottom walls 274. As shown in FIGS. 3C-3D, an upper surface 271 of the conductive liquid 270 has a concave crescent shape. The edges 275 of the upper surface 271 may serve as pinned contact lines during the flow of the conductive liquid 270. As shown in FIG. 3D, the advancing front surface 276 of the conductive liquid 270 also has a convex crescent shape. The edges 277 of the front surface 276 may serve as leading edges directing the flow forward. The formation of the menisci may generate a pressure gradient that can drive the flow down the capillary channel 216 with viscous resistance provided by the friction at the channel walls 272.

Figure 4A:
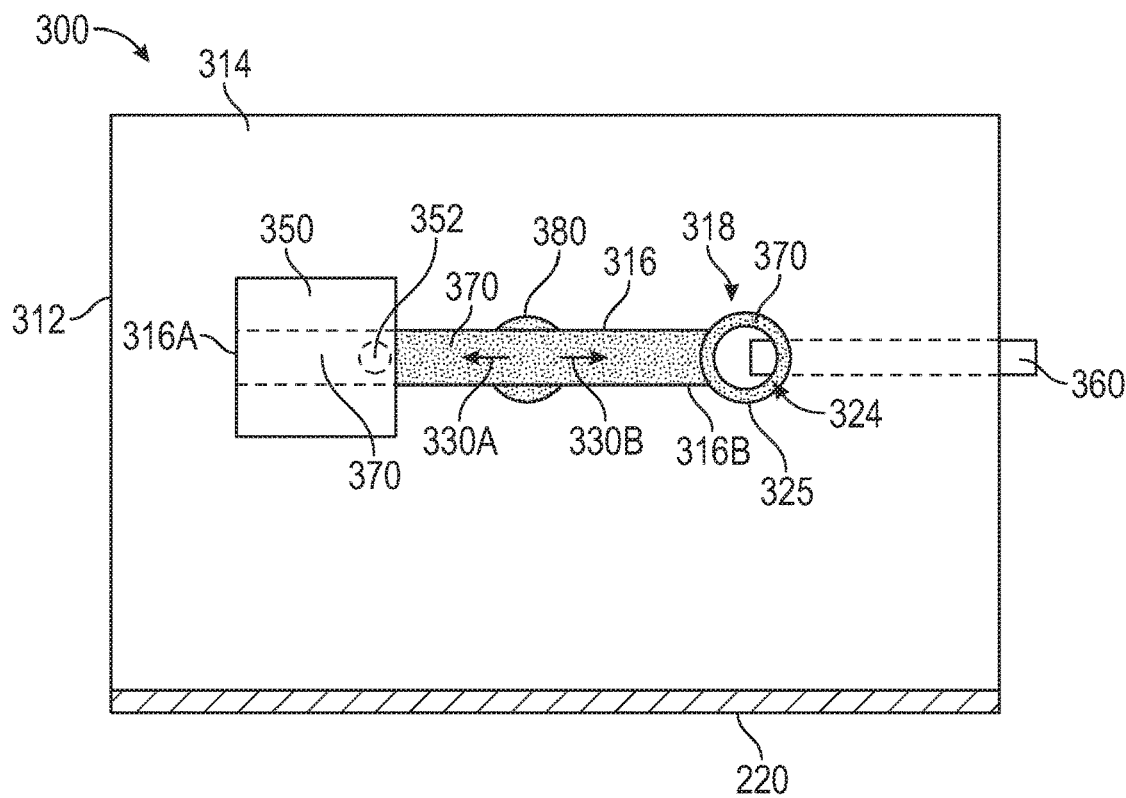
FIG. 4A is a schematic overhead view of the article of FIG. 3A after which the conductive liquid flows in the microchannel in part by capillary action.
Figure 4B:
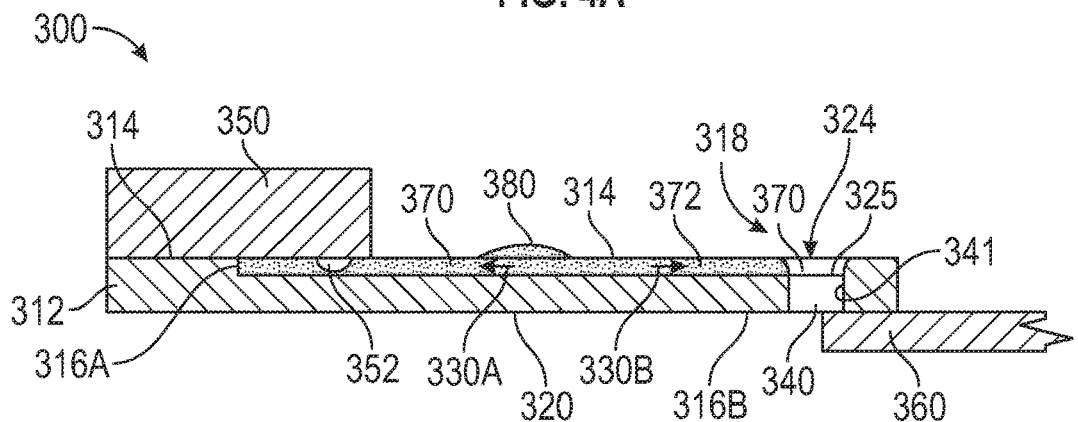
FIG. 4B is a schematic cross-sectional view along line C-C' of the article of FIG. 4A.

Referring now to FIGS. 4A-4B, the conductive liquid 370 as initially deposited in the form of a laterally unconstrained drop 380 on the first major surface 314 of the substrate 312, and moves via capillarity along the channel 316 in opposing directions 330A and 330B toward the first end 316A of the channel 316 and the second end 316B of the channel, respectively. At the first end 316A of the channel 316, the conductive liquid 370 contacts, spreads, and at least partially wets the exposed surface of the conductive pad 352 on the solid circuit die 350. At the second end 316B of the channel 316, the conductive liquid 370 flows into the first region 322 of the bore 318. The conductive liquid 370 spills over the edge 319, flows along the bore walls 325 of the first region 322, and collects on the shoulder 324. In the embodiment of FIGS. 4A-4B, dimensions such as, for example, the shape of the edge 319, the width of the first region 322 of the bore 318, and the dimensions of the bore wall 325 are proportional to the amount of conductive liquid 370 flowing into the region 322, such that the conductive liquid 370 fully occupies the shoulder 324, but does not enter the cylindrical portion 340 of the bore 318. In other embodiments not illustrated in FIGS. 4A-4B, the conductive liquid may spill over the shoulder 324, down the walls 341 of the second region 340 of the bore 318, and contact the conductive trace 360 underlying the second region 340.

Figure 4C:
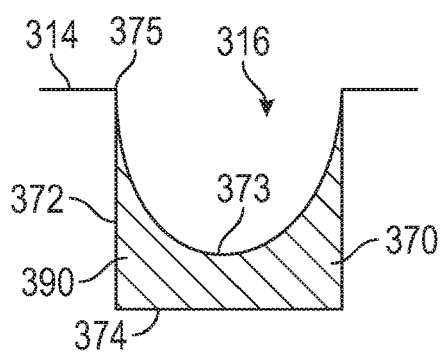
FIG. 4C is a schematic cross-sectional view of the microchannel in the article of FIG. 4A after the conductive liquid has been solidified to form a conductive trace in the microchannel.

Referring to FIG. 4C, in some embodiments the conductive liquid 370 can be solidified, cured, hardened and the like to form an electrically conductive trace 390 deposited on both side walls 372 and the bottom wall 374 of the channel 316. Suitable processes that can be used to enhance the solidification of the conductive liquid 370 may include, for example, curing or evaporating by heat or radiation. In some embodiments, the curvature of the upper surface of the conductive trace may increase to form a new upper surface 373. During the process of solidification, the pinned contact line 375 may initiate liquid flow from the center of the channel 316 toward the side walls 372. The volume of the conductive liquid 370 decreases when the liquid carrier is removed therefrom. The thickness of the deposited solid material left behind following solidification of the conductive liquid 370 depends on the solid loading of the conductive liquid 370, but in some embodiments, which are not intended to be limiting, the deposited solid material forming the conductive trace 390 may have a thickness of, for example, from about 0.01 micrometers to about 200 micrometers, from about 0.05 micrometers to about 100 micrometers, or from about 0.1 micrometers to about 10 micrometers.

The solidification process may leave some void space in the channel 316 underneath the circuit die 350. In some embodiments (not shown in FIGS. 4A-4C), the void space can optionally be filled with an encapsulant material to, for example, protect the contact pad 352 from corrosion, or to enhance the structural strength of the construction 300. In various embodiments, the encapsulant material may include, for example, a dielectric material, a polymeric material, and the like. Examples of suitable encapsulants include, but are not limited to, polyurethane, epoxy, polythiolene, acrylates including urethane acrylates, silicones, and polydimethylsiloxane (PDMS). In some embodiments, the encapsulant material can be delivered by capillary liquid flow to fill the open regions of the channel 316 following solidification of the conductive liquid 370. The liquid encapsulant can then be solidified to reinforce the contact interface formed between the electrically conductive traces and the contact pads 352 of the circuit die 350.

Figure 5A:
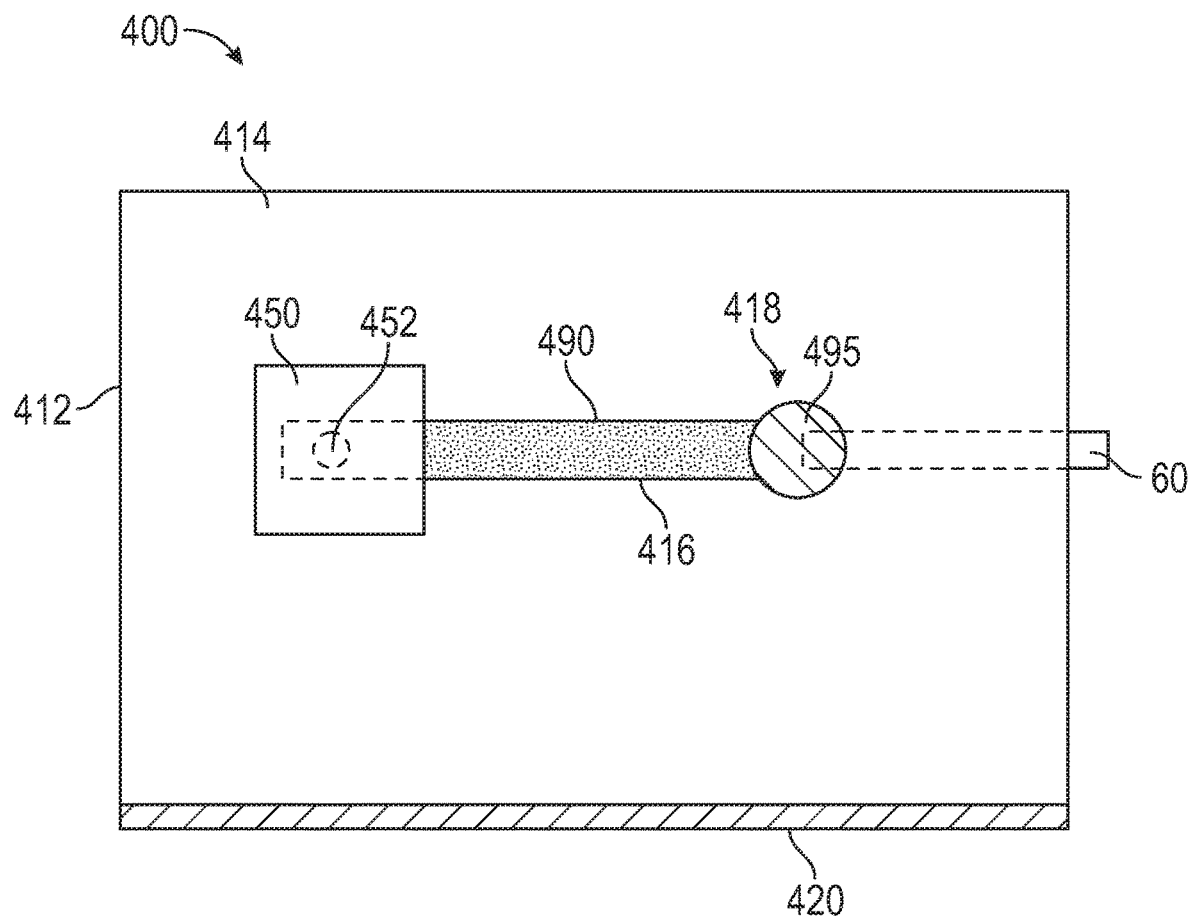
FIG. 5A is a schematic overhead view of the article of FIG. 4A after a second conductive liquid has been applied in the bore at the second end of the microchannel.
Figure 5B:
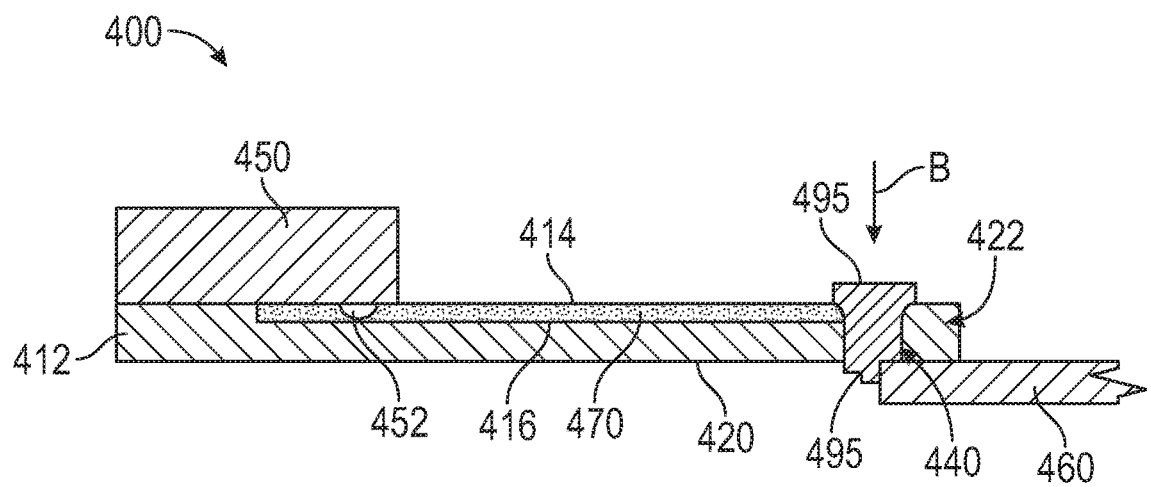
FIG. 5B is a schematic cross-sectional view along line D-D' of the article of FIG. 5A.

As shown in the construction 400 in FIGS. 5A-5B, in some embodiments a second conductive liquid 495, different from the first conductive liquid that has previously been solidified to form the conductive trace 490 in the channel 416 (FIGS. 4A-4C), is deposited along the direction of the arrow B and backfilled in the bore 418. The second conductive liquid 495 can include any of the conductive liquids discussed above, including a conductive metal such as silver ink, silver nanoparticle ink, reactive silver ink, copper ink, and conductive polymer inks, as well as liquid metals or alloys (e.g., metals or alloys that melt at relatively low temperatures and solidify at room temperatures), and the like. In some embodiments, the second conductive liquid 495 is a molten metal or metal alloy such as, for example, copper, silver, gold, and mixtures and combinations thereof. In some embodiments, the second conductive liquid 495 is a conductive ink that is curable with actinic radiation such as, for example, a UV curable or activated ink.

The bore 418 may optionally be cleared with a laser, chemical etch, or the like to ensure that the bore 418 is substantially free of the first conductive liquid and portions of the conductive trace 490 prior to filling the bore 418 with the second conductive liquid 495. The second conductive liquid 495 flows into the first region 422 of the bore 418, substantially fills the second region 440 of the bore 418, and contacts the conductive trace 460 on the second major surface 420 of the substrate 412 to form an electrical connection to the conductive trace 460. Since the conductive trace 490 formed in the channel 416 substantially occupies the shoulder 424 of the first region 422 of the bore 418, as well as a substantial portion of the volume of the channel 416, the second conductive liquid 495 does not flow back into the channel 416, but is confined within the bore 418. In various embodiments, various properties of the conductive liquid 495 such as, for example, viscosity, may be selected to reduce the likelihood of back flow into the channel 416.

The second conductive liquid 495 may then optionally be solidified (not shown in FIGS. 5A-5B) to electrically connect the conductive trace 490 in the channel 416 to the conductive trace 460 on the second major surface 420 of the substrate 412, and thereby electrically connect the contact pad 452 on the solid circuit die 450 to the conductive trace 460. Suitable processes that can be used to optionally enhance the solidification of the conductive liquid 495 may include, for example, curing or evaporating by heat or radiation. In various embodiments, the solidification process may be selected to rapidly dry the conductive liquid 495 to reduce the likelihood of back flow into the channel 416.

The present disclosure further provides processes for automatic registration between an electrical contact pad on an electronic component (e.g., a solid circuit die) and electrically conductive interconnects such as, for example, conductive traces. In general, the solid circuit die is placed on a substrate such that the contact pads on the circuit die reside within microchannels on the first major surface of the substrate. Electrically conductive traces are formed in the channels by flowing a conductive liquid in the channels toward the contact pads on the first end of the channels to obtain automatic registration with the electrically conductive interconnects positioned on the second major surface of the substrate beneath a bore at the second end of the channel.

In some embodiments, the flexible substrate may be a web of a polymeric material having an indefinite length, and a suitable pattern of microchannels may be formed on or in a major surface of the web using, for example, microreplication processes such as embossing, or via printing processes such as, for example, microcontact printing, screen printing, and the like. The web with microchannels may be used in a high-speed, roll-to-roll manufacturing process to electrically connect circuit components to rapidly produce low-cost circuits for electronic devices including, for example, radio-frequency identification (RFID) tags, near field communication (NFC) circuits, Bluetooth circuits, Wi-Fi circuits, microprocessor chips, and the like.

In one embodiment of a method for manufacturing an electronic device a substrate includes a first major surface with a microchannel having a first end and a second end. A conductive liquid is dispensed in the microchannel to cause the conductive liquid to move, primarily by capillary pressure, in a first direction toward the first end of the microchannel and in a second direction toward the second end of the microchannel. The conductive liquid is solidified to form an electrically conductive trace electrically connecting a first electronic device at the first end of the microchannel to a second electronic device at the second end of the microchannel.

Figure 6:
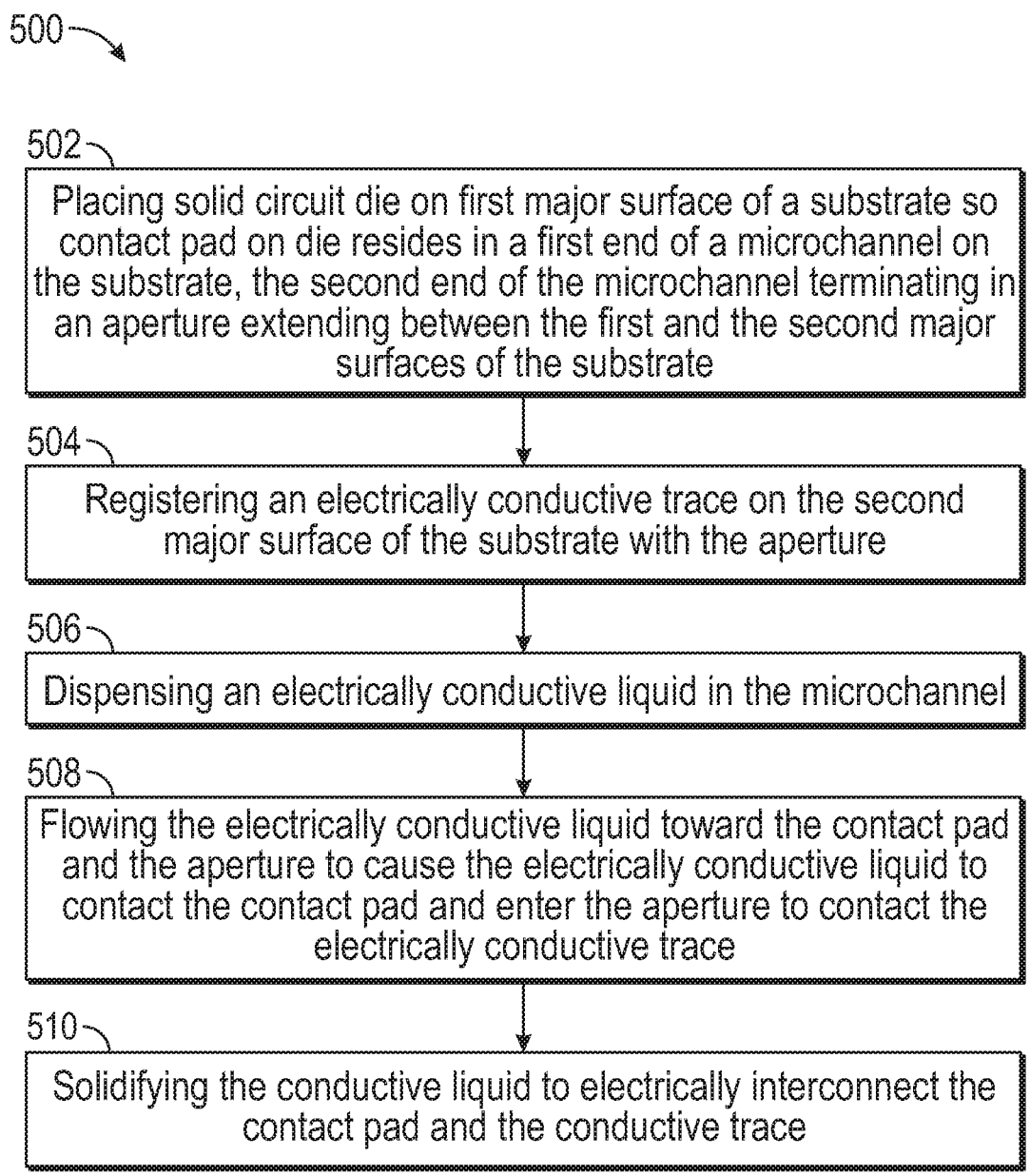
FIG. 6 is a flow chart summarizing a method of making an electronic device according an embodiment of a method of the present disclosure.

In another embodiment of a method 500 for manufacturing an electronic device outlined in FIG. 6, in step 502 a solid circuit die is placed on a first major surface of a substrate. The first major surface of the substrate includes a configuration of microchannels with a substantially constant width and depth from a first end to a second end thereof. A contact pad on the solid circuit die resides in the first end of the microchannel, and the second end of the microchannel terminates in a bore extending between the first major surface of the substrate and an opposing second major surface thereof.

In step 504, an electrically conductive trace is registered on the second major surface of the substrate with the bore at the second end of the microchannel.

In step 506, a conductive liquid is dispensed in the microchannel between the first end and the second end thereof.

In step 508, the conductive liquid is flowed, primarily by capillary pressure, in a first direction toward the contact pad and in a second direction toward the bore, wherein the conductive liquid directly contacts the contact pad on the solid circuit die and enters the bore to directly contact the electrically conductive trace.

In step 510, the conductive liquid is solidified to electrically interconnect the contact pad and the electrically conductive trace.

Figure 7:
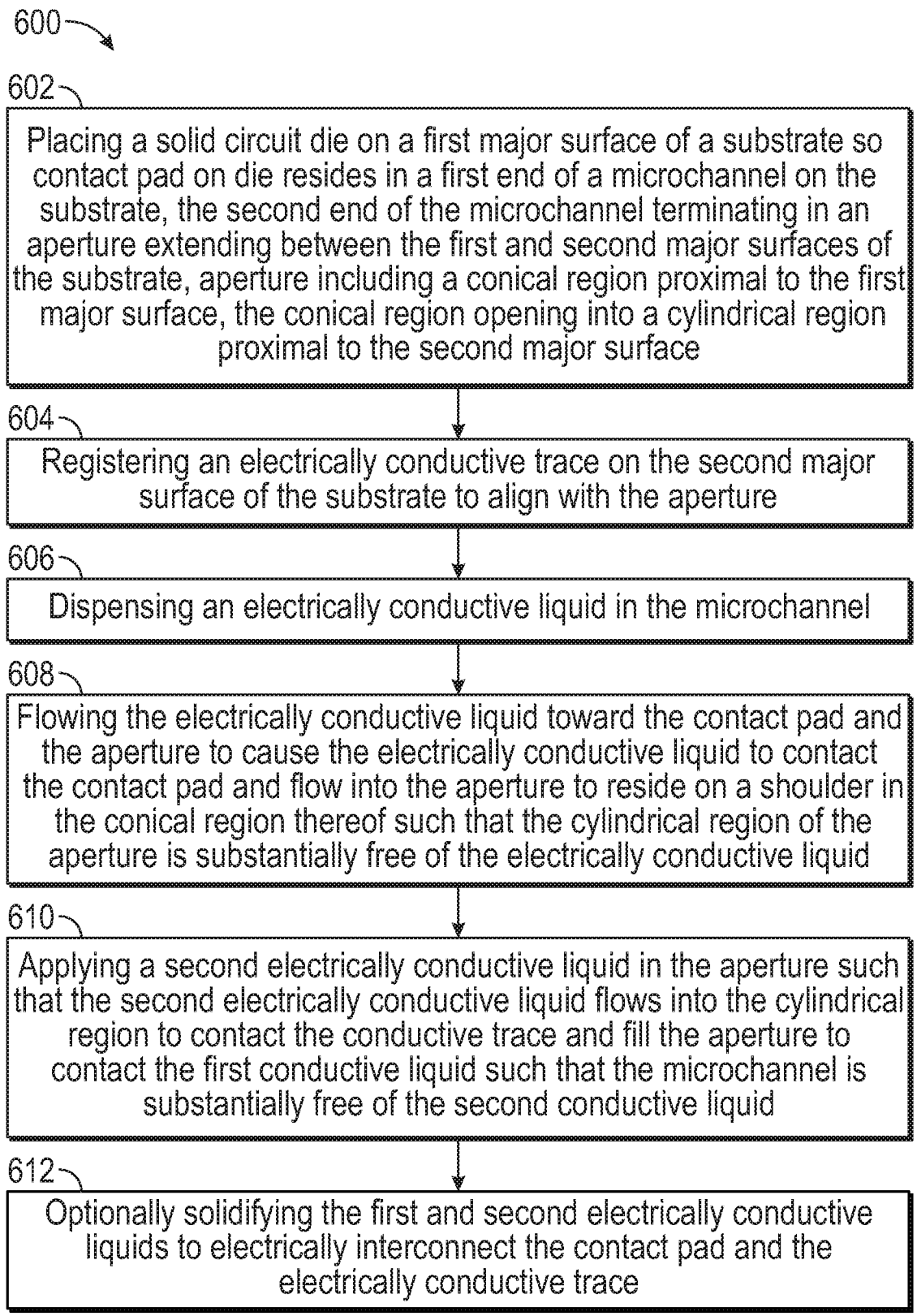
FIG. 7 is a flow chart summarizing a method of making an electronic device according an embodiment of a method of the present disclosure.

In another embodiment of a method for manufacturing an electronic device 600 outlined in FIG. 7, in step 602 a solid circuit die is placed on a first major surface of a substrate. The first major surface of the substrate includes a microchannel with a substantially constant width and depth, and extends from a first end to a second end thereof. A contact pad on the solid circuit die resides in the first end of the microchannel, and the second end of the microchannel terminates in a bore extending between the first major surface of the substrate and an opposing second major surface thereof. The bore includes a first region proximal to the first major surface of the substrate, and the first region opens into a second region proximal to the second major surface of the substrate.

In step 604, an electrically conductive trace is registered on the second major surface of the substrate with the second region of the bore.

In step 606, a first conductive liquid is dispensed in the microchannel between the first end and the second end thereof.

In step 608, the first conductive liquid is flowed, primarily by capillary pressure, in a first direction toward the contact pad and in a second direction toward the bore. The conductive liquid directly contacts the contact pad on the solid circuit die and flows into the bore to reside on a shoulder in the first region thereof such that the second region of the bore is substantially free of the first conductive liquid.

In step 610, a sufficient amount of a second conductive liquid, different from the first conductive liquid, is applied in the bore such that the second conductive liquid flows into the second region thereof to directly contact the conductive trace and fill the bore to directly contact the first conductive liquid on the shoulder of the first region, wherein the microchannel on the first major surface of the substrate is substantially free of the second conductive liquid.

In step 612, the first conductive liquid and the second conductive liquid are solidified to electrically interconnect the contact pad and the electrically conductive trace.

In some embodiments of the methods discussed above, the substrate can have a registration feature shaped to receive the electronic component, and at least one channel shaped to extend away from an area that corresponds with one of the contacts when the electronic component is disposed within the registration feature.

In the present disclosure, the conductive liquid delivered into the channels can automatically register with the circuit dies by wetting out, via capillary action, various surfaces of registration features and circuit dies on the substrate (e.g., channel walls, side walls of the pocket, side surfaces of the circuit die, etc.). The flow of the conductive liquid on the various capillary surfaces can be automatically directed at least in part by capillary force, which makes optional the use of fluid pumps, vacuum and the like to pump the electrically conductive fluid toward the circuit die or the conductive traces registered with the substrate. After the automatic registration, the conductive liquid can be further solidified to form a solid, continuous layer. The process can be repeated to form a multilayer structure aligned with the solid circuit die on the substrate.

In some embodiments, after the formation of electrically conductive traces in the channels, the channels can be optionally filled with an encapsulant material to protect the structure of the conductive traces or the contact pads on the electronic device. The encapsulant material may include, for example, a dielectric material, a polymeric material, and the like. In some embodiments, the encapsulant material can be delivered via capillary liquid flow to fill the channels. The encapsulant liquid can then be solidified to form an encapsulant material to protect the underneath traces, circuit dies, and contacts formed therebetween.

When electrically conductive traces are formed and automatically registered with contact pads on circuit dies, the traces can be connected concurrently, or at a later time, to other portions of a circuit or other circuits or devices. In some embodiments, additional metal traces (e.g., Cu traces) can be patterned in registration to the electrically conductive traces. In some embodiments, for example, the electrically conductive traces can be connected to an antenna coil of an electronic device such as a receiver or transmitter. In some example embodiments, which are not intended to be limiting, the processes described herein can be used to make various chip-based circuits/devices including, for example, radio-frequency identification (RFID) tags, near field communication (NFC) circuits, Bluetooth circuits, Wi-Fi circuits, microprocessor chips, and the like.

EMBODIMENTS

Embodiment A. A method for manufacturing an electronic device, comprising:
 providing a substrate with a first major surface comprising a microchannel, wherein the microchannel has a first end and a second end;
 dispensing a conductive liquid in the microchannel to cause the conductive liquid to move, primarily by capillary pressure, in a first direction toward the first end of the microchannel and in a second direction toward the second end of the microchannel; and
 solidifying the conductive liquid to form an electrically conductive trace electrically connecting a first electronic device at the first end of the microchannel to a second electronic device at the second end of the microchannel.
Embodiment B. The method of Embodiment A, wherein the volume of the conductive liquid dispensed in the microchannel is significantly larger than the volume of the portion of the channel underlying the conductive liquid dispensed therein.
Embodiment C. The method of any of Embodiments A and B, wherein the microchannel has a substantially constant width and depth from the first end to the second end.
Embodiment D. The method of any of Embodiments A to C, wherein the second end of the microchannel terminates in a bore extending from the first major surface of the substrate to a second major surface of the substrate opposite the first major surface.
Embodiment E. The method of Embodiment D, wherein the first electronic device is on the first major surface of the substrate and the second electronic device is on the second major surface of the substrate and underlying the bore.
Embodiment F. The method of any of Embodiments A to E, wherein the substrate comprises a flexible polymeric material.
Embodiment G. The method of Embodiment F, wherein the substrate comprises a web of polymeric material having an indefinite length.
Embodiment H. The method of any of Embodiments A to G, wherein the first electronic component is a solid circuit die placed on the first major surface of the substrate such that a contact pad on the solid circuit die resides in the first end of the microchannel.
Embodiment I. The method of Embodiment H, wherein the solid circuit die is a semiconductor die.
Embodiment J. The method of any of Embodiments G to I, wherein placing the solid circuit die comprises mounting the solid circuit die on the first major surface of the substrate with an adhesive.
Embodiment K. The method of any of Embodiments G to J, wherein the contact pad is located on a bottom surface of the solid circuit die.
Embodiment L. The method of any of Embodiments A to K, wherein the microchannel further comprises a feature projecting upward from the first major surface of the substrate to control the flow of the conductive liquid within the channel, wherein the feature is between the first and the second ends of the microchannel.
Embodiment M. The method of any of Embodiments A to L, wherein the conductive liquid comprises an electrically conductive ink.
Embodiment N. The method of Embodiment M, wherein the electrically conductive ink comprises a metal chosen from copper, silver, gold, and mixtures and combinations thereof.
Embodiment O. A method for manufacturing an electronic device, comprising:
 placing a solid circuit die on a first major surface of a substrate comprising a microchannel such that at least one contact pad on the solid circuit die resides in a first end of the microchannel, wherein a second end of the microchannel terminates in a bore extending between the first major surface of the substrate and an opposing second major surface thereof;
 registering an electrically conductive trace on the second major surface of the substrate with the bore at the second end of the microchannel;
 dispensing a conductive liquid in the microchannel between the first end and the second end thereof, wherein the volume of the conductive liquid dispensed in the microchannel is significantly larger than the volume of the portion of the channel underlying the conductive liquid dispensed; and
 flowing the conductive liquid, primarily by capillary pressure, in a first direction toward the contact pad and in a second direction toward the bore, wherein the conductive liquid directly contacts the contact pad on the solid circuit die and enters the bore to directly contact the electrically conductive trace; and
 solidifying the conductive liquid to form an electrically conductive trace on the first major surface of the substrate electrically connecting the contact pad on the solid circuit die to the electrically conductive trace on the second major surface of the substrate.

Embodiment P. The method of Embodiment O, wherein the microchannel has a substantially constant width and depth from the first end to the second end thereof.

Embodiment Q. The method of any of Embodiments O to P, wherein the substrate comprises a flexible polymeric material.

Embodiment R. The method of any of Embodiments O to Q, wherein the substrate comprises a web of polymeric material having an indefinite length.

Embodiment S. The method of any of Embodiments O to R, wherein the solid circuit die is a semiconductor die.

Embodiment T. The method of any of Embodiments O to S, wherein placing the solid circuit die comprises mounting the solid circuit die on the first major surface of the substrate with an adhesive.

Embodiment U. The method of any of Embodiments O to T, wherein the contact pad is located on a bottom surface of the solid circuit die.

Embodiment V. The method of any of Embodiments O to U, wherein the microchannel further comprises a feature projecting upward from the first major surface of the substrate to control the flow of the conductive liquid within the channel, wherein the feature is between the first and the second ends of the microchannel.

Embodiment W. The method of any of Embodiments O to V, wherein the conductive liquid comprises an electrically conductive ink.

Embodiment X. The method of Embodiment W, wherein the electrically conductive ink comprises a metal chosen from copper, silver, gold, and mixtures and combinations thereof.

Embodiment Y. The method of any of Embodiments O to X, further comprising applying an encapsulant liquid to the microchannel after solidifying the conductive liquid.

Embodiment Z. A method for manufacturing an electronic device, comprising:
- placing a solid circuit die on a first major surface of a substrate comprising a microchannel with a first end and a second end, wherein a contact pad on the solid circuit die resides in the first end of the microchannel, and wherein the second end of the microchannel terminates in a bore extending between the first major surface of the substrate and an opposing second major surface thereof, the bore comprising a first region proximal to the first major surface of the substrate, the first region of the bore opening into a second region proximal to the second major surface of the substrate;
- registering an electrically conductive trace on the second major surface of the substrate with the cylindrical region of the bore;
- dispensing a first conductive liquid in the microchannel between the first end and the second end thereof;
- flowing the first conductive liquid, primarily by capillary pressure, in a first direction toward the contact pad and in a second direction toward the bore, wherein the conductive liquid directly contacts the contact pad on the solid circuit die and flows into the bore to reside on a shoulder in the first region of the bore such that the second region of the bore is substantially free of the first conductive liquid;
- applying a sufficient amount of a second conductive liquid, different from the first conductive liquid, in the bore such that the second conductive liquid flows into the second region thereof to directly contact the conductive trace and fill the bore to directly contact the first conductive liquid on the shoulder of the first region of the bore, and wherein the microchannel on the first major surface of the substrate is substantially free of the second conductive liquid; and
- solidifying the first conductive liquid and the second conductive liquid to form an electrically conductive trace on the first major surface of the substrate connecting the contact pad on the solid circuit die with the electrically conductive trace on the second major surface of the substrate.

Embodiment AA. The method of Embodiment Z, wherein the volume of the conductive liquid dispensed in the microchannel is significantly larger than the volume of the portion of the channel underlying the conductive liquid dispensed.

Embodiment BB. The method of any of Embodiments Z to AA, wherein the microchannel has a substantially constant width and depth from the first end to the second end thereof.

Embodiment CC. The method of any of Embodiments Z to BB, comprising solidifying the first conductive liquid, prior to applying the second conductive liquid, to form an electrically conductive trace on the first major surface of the substrate in direct contact with the contact pad on the solid circuit die such that the subsequently applied second conductive liquid makes direct contact with the electrically conductive trace on the first major surface of the substrate.

Embodiment DD. The method of any of Embodiments Z to CC, wherein the substrate comprises a flexible polymeric material.

Embodiment EE. The method of Embodiment DD, wherein the substrate comprises a web of a polymeric material having an indefinite length.

Embodiment FF. The method of Embodiment EE, wherein the method is carried out on a roll-to-roll apparatus.

Embodiment GG. The method of any of Embodiments Z to FF, wherein the solid circuit die is a semiconductor die.

Embodiment HH. The method of any of Embodiments Z to GG, wherein the microchannel further comprises a flow control feature projecting upward from the first major surface of the substrate, wherein the flow control feature is between the first and the second ends of the microchannel.

Embodiment II. The method of any of Embodiments Z to HH, wherein the first conductive liquid comprises a conductive ink.

Embodiment JJ. The method of Embodiment II, wherein the conductive ink comprises a metal chosen from copper, silver, gold, and mixtures and combinations thereof.

Embodiment KK. The method of any of Embodiments Z to JJ, further comprising applying an encapsulant liquid to the microchannel after solidifying the first conductive liquid.

Embodiment LL. An article, comprising:
- a flexible polymeric substrate with a first major surface comprising at least one microchannel with a substantially constant width and depth and extending from a first end to a second end thereof, wherein the second end of the microchannel terminates in a bore extending between the first major surface of the substrate and an opposing second major surface thereof;
- a solid circuit die on the first major surface of the substrate, wherein a contact pad of the solid circuit die resides in the first end of the microchannel;
- a first electrically conductive trace on the second major surface of the substrate and aligned with the bore at the second end of the microchannel;
- a conductive liquid in the microchannel and in the bore, wherein the conductive liquid contacts the contact pad on the solid circuit die and the first electrically conductive trace on the second major surface of the substrate.

Embodiment MM. The article of Embodiment LL, wherein the substrate comprises a web of a polymeric material having an indefinite length.

Embodiment NN. The article of any of Embodiments LL to MM, wherein the solid circuit die is a semiconductor die.

Embodiment OO. The article of any of Embodiments LL to NN, further comprising an adhesive layer between the solid circuit die and the first major surface of the substrate.

Embodiment PP. The article of any of Embodiments LL to OO, wherein the contact pad is located on a bottom surface of the solid circuit die.

Embodiment QQ. The article of any of Embodiments LL to PP, wherein the conductive liquid comprises a conductive ink.

Embodiment RR. An article, comprising:
- a flexible polymeric substrate with a first major surface comprising at least one microchannel with a substantially constant width and depth and extending from a first end to a second end thereof, wherein the second end of the microchannel terminates in a bore extending between the first major surface of the substrate and an opposing second major surface thereof, the bore comprising a first region proximal to the first major surface of the substrate, the first region opening into a second region proximal to the second major surface of the substrate;
- a solid circuit die on the first major surface of the substrate, wherein a contact pad of the solid circuit die resides in the first end of the microchannel;
- a first electrically conductive trace on the second major surface of the substrate, wherein the first electrically conductive trace is aligned with the cylindrical region of the bore;
- a first conductive liquid in the microchannel directly contacting the contact pad on the solid circuit die and extending onto a shoulder in the first region of the bore, wherein the first conductive liquid does not extend into the second region of the bore; and
- a second conductive liquid in the second region of the bore and contacting the first conductive liquid and the first conductive trace.

Embodiment SS. The article of Embodiment RR, wherein the substrate comprises a web of a polymeric material having an indefinite length.

Embodiment TT. The article of any of Embodiments RR to SS, wherein the solid circuit die is a semiconductor die.

Embodiment UU. The article of any of Embodiments RR to TT, further comprising an adhesive layer between the solid circuit die and the first major surface of the substrate.

Embodiment VV. The article of any of Embodiments RR to UU, wherein the first and the second conductive liquids each comprise a conductive ink.

Embodiment WW. The article of any of Embodiments RR to VV, wherein the first conductive liquid is a conductive ink and the second conductive liquid is a metal.

Various embodiments of the invention have been described. These and other embodiments are within the scope of the following claims.

The invention claimed is:
1. A method for manufacturing an electronic device, comprising:
   providing a substrate with a first major surface comprising a microchannel, wherein the microchannel has a first end and a second end, wherein the second end of the microchannel terminates in a bore extending from the first major surface of the substrate to a second major surface of the substrate opposite the first major surface;
   dispensing a conductive liquid in the microchannel to cause the conductive liquid to move, primarily by capillary pressure, in a first direction toward the first end of the microchannel and in a second direction toward the second end of the microchannel; and
   solidifying the conductive liquid to form an electrically conductive trace electrically connecting a first electronic device at the first end of the microchannel to a second electronic device at the second end of the microchannel, wherein the first electronic device is on the first major surface of the substrate and the second electronic device is on the second major surface of the substrate and underlying the bore.

2. The method of claim 1, wherein the volume of the conductive liquid dispensed in the microchannel is larger than the volume of the portion of the channel underlying the conductive liquid dispensed therein.

3. The method of claim 1, wherein the microchannel has a substantially constant width and depth from the first end to the second end.

4. The method of claim 1, wherein the substrate comprises a flexible polymeric material.

5. The method of claim 4, wherein the substrate comprises a web of polymeric material having an indefinite length.

6. The method of claim 1, wherein the conductive liquid comprises an electrically conductive ink.

7. A method for manufacturing an electronic device, comprising:
   placing a solid circuit die on a first major surface of a substrate comprising a microchannel with a first end and a second end, wherein a contact pad on the solid circuit die resides in the first end of the microchannel, and wherein the second end of the microchannel terminates in a bore extending between the first major surface of the substrate and an opposing second major surface thereof, the bore comprising a first region proximal to the first major surface of the substrate, the first region of the bore opening into a second region proximal to the second major surface of the substrate;
   registering an electrically conductive trace on the second major surface of the substrate with a cylindrical region of the bore;
   dispensing a first conductive liquid in the microchannel between the first end and the second end thereof;
   flowing the first conductive liquid, primarily by capillary pressure, in a first direction toward the contact pad and in a second direction toward the bore, wherein the conductive liquid directly contacts the contact pad on the solid circuit die and flows into the bore to reside on a shoulder in the first region of the bore such that the second region of the bore is substantially free of the first conductive liquid;
   applying a sufficient amount of a second conductive liquid, different from the first conductive liquid, in the bore such that the second conductive liquid flows into the second region thereof to directly contact the conductive trace and fill the bore to directly contact the first conductive liquid on the shoulder of the first region of the bore, and wherein the microchannel on the first major surface of the substrate is substantially free of the second conductive liquid; and
   solidifying the first conductive liquid and the second conductive liquid to form an electrically conductive trace on the first major surface of the substrate connecting the contact pad on the solid circuit die with the electrically conductive trace on the second major surface of the substrate.

8. The method of claim 7, wherein the volume of the conductive liquid dispensed in the microchannel is significantly larger than the volume of the portion of the channel underlying the conductive liquid dispensed.

9. The method of claim 7, wherein the microchannel has a substantially constant width and depth from the first end to the second end thereof.

10. The method of claim 7, wherein the substrate comprises a flexible polymeric material.

* * * * *